US009046557B2

(12) United States Patent
Pauli

(10) Patent No.: US 9,046,557 B2
(45) Date of Patent: Jun. 2, 2015

(54) ISOLATION ADAPTER FOR A VEHICLE COMPONENT TEST AND TEST METHOD FOR A VEHICLE COMPONENT

(75) Inventor: Christian Pauli, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 14/241,229

(22) PCT Filed: May 16, 2012

(86) PCT No.: PCT/EP2012/002093
§ 371 (c)(1),
(2), (4) Date: Feb. 26, 2014

(87) PCT Pub. No.: WO2013/029698
PCT Pub. Date: Mar. 7, 2013

(65) Prior Publication Data
US 2015/0006024 A1 Jan. 1, 2015

(30) Foreign Application Priority Data
Aug. 27, 2011 (DE) .......................... 10 2011 111 808

(51) Int. Cl.
*G01R 31/00* (2006.01)
*G01R 31/28* (2006.01)
*H01H 1/56* (2006.01)
*H01H 9/00* (2006.01)
*H01H 19/12* (2006.01)

(52) U.S. Cl.
CPC ............ *G01R 31/007* (2013.01); *G01R 31/281* (2013.01); *H01H 1/56* (2013.01); *H01H 9/0005* (2013.01); *H01H 19/12* (2013.01)

(58) Field of Classification Search
None
See application file for complete search history.

(56) References Cited

U.S. PATENT DOCUMENTS 3,286,048 A 11/1966 Golbeck
3,889,273 A 6/1975 Deiss et al.
(Continued)

FOREIGN PATENT DOCUMENTS

DE 1690128 4/1971
DE 2704382 8/1977
(Continued)

OTHER PUBLICATIONS

English Language International Search Report for PCT/EP2012/002093, mailed Jun. 17, 2013, 3 pages.
(Continued)

*Primary Examiner* — John R Olszewski
*Assistant Examiner* — Gerrad A Foster
(74) *Attorney, Agent, or Firm* — Staas & Halsey LLP

(57) ABSTRACT

In the development of a vehicle component, provision may be made for a component to be tested during a test drive. Thus, the behavior of the vehicle component in the event of failure of a sensor, for example, can be tested. The aim is to enable systematic checking of a mode of operation of a vehicle component. An isolation adapter has a terminal for the vehicle component and a switching device that has a plurality of switch contacts to which a respective test circuit can be connected. An electrical connection between the terminal and at least one of the switch contacts can be produced by switching the switching device. Even during switching, there is always an electrical connection to at least one of the switch contacts. The isolation adapter may also have a display unit that mechanically detects a switching position of the switching device.

12 Claims, 4 Drawing Sheets

(56) References Cited

U.S. PATENT DOCUMENTS

| | | | |
|---|---|---|---|
| 4,112,274 A | 9/1978 | Pigman et al. | |
| 2006/0136119 A1* | 6/2006 | Raichle et al. | 701/114 |
| 2006/0244431 A1* | 11/2006 | Dohnal et al. | 323/258 |
| 2012/0226408 A1* | 9/2012 | Miller et al. | 701/31.5 |

FOREIGN PATENT DOCUMENTS

| | | |
|---|---|---|
| DE | 19616516 | 7/1997 |
| DE | 19933824 | 2/2001 |
| DE | 10018206 | 10/2001 |
| DE | 10331326 | 1/2004 |
| DE | 102004056778 | 6/2006 |
| DE | 102006008539 | 8/2007 |
| DE | 102006031242 | 1/2008 |
| DE | 12011111808.3 | 8/2011 |
| EP | 0678961 | 10/1995 |
| EP | 2015084 | 1/2009 |
| EP | PCT/EP2012/002093 | 5/2012 |

OTHER PUBLICATIONS

German Office Action for German Priority Patent Apptication No. 10 2011 111 808.3, issued Mar. 29, 2012, 5 pages.

* cited by examiner

ISOLATION ADAPTER FOR A VEHICLE COMPONENT TEST AND TEST METHOD FOR A VEHICLE COMPONENT

CROSS REFERENCE TO RELATED APPLICATIONS

This application is based on and hereby claims priority to International Application No. PCT/EP2012/002093 filed on May 16, 2012 and German Application No. 10 2011 111 808.3 filed on Aug. 27, 2011, the contents of which are hereby incorporated by reference.

BACKGROUND

The invention relates to two isolation adapters and a method for checking a functionality of a vehicle component during a test drive.

In the development of an electronic controller, such as a controller for an anti-lock brake system or for a tire-pressure monitor for example, provision can be made to check a prototype of the controller during a test drive. In this way, it is possible to determine, for example, how the controller behaves when a sensor from which the signal is required by the controller for operating in the intended manner fails during driving.

For a test drive of this kind, the controller is installed in a car and connected to the actuators and sensors which are to be operated from the controller. Instead of connecting the actuators and sensors directly to the controller in the process, the electrical connection is established via an isolation adapter. In the simplest case, said isolation adapter may be a patchboard to which the controller and the peripheral components (actuators and sensors) are connected. The electrical connections are then established by inserting individual short-circuiting links into a patchpanel of the patchboard. A test driver can then deliberately interrupt individual connections by pulling out short-circuiting links during the test drive. Similarly, it is possible, for example, to create a short circuit in a connecting line by plugging a cable in.

If the test driver then observes undesired reactions of the controller, he can read off the existing connection pattern of the controller to the peripheral components on the patchpanel. However, this is neither detected by measurement nor clearly displayed on a display.

DE 196 16 516 C1 discloses an isolation adapter in which an electrical connection between a unit under test, that is to say a controller for example, and a sensor or actuator can be interrupted by an isolation device being folded out of a corresponding compartment. It is possible to use the folded-out isolation devices to identify which connections are currently interrupted. Short circuits cannot be produced with isolation devices of this kind which can be folded out.

EP 0 678 961 A1 discloses a circuit with which a switching state of a bridge circuit can be electrically detected and displayed by a monitoring circuit. One disadvantage of a circuit of this kind is that a measurement current of the monitoring circuit influences the current flowing in the bridge circuit.

A further disadvantage in modern isolation adapters is that the extent to which the change between two switching states of the isolation adapter itself has an influence on the behavior of the controller is unclear. Therefore, it is possible, for example in the case of a patchboard, for a cable to have an unknown potential during the switchover.

It may also be possible for only a sequence of different faulty connection patterns of a controller which is to be tested to trigger a specific behavior of the controller. This behavior may then be difficult to reproduce.

SUMMARY

One possible object is to allow systematic checking of a functionality of a vehicle component.

The inventor proposes an isolation adapter, which ensures that the switching device of said isolation adapter on the one hand and the display of said switching device for the switching state of said switching device on the other hand have as little influence as possible on the functionality of the vehicle component which is to be tested. In other words, these elements of the isolation adapter should not react to the vehicle component which is to be tested as far as possible.

The proposed isolation adapter has a connection for the vehicle component which is to be tested, and a switching device which is coupled to the connection and has a plurality of switching contacts, it being possible for a test circuit to be connected to each of said switching contacts. The test circuits may be, for example, a circuit which connects the vehicle component to a sensor or to an actuator in a manner which is intended for fault-free operation of the vehicle component. Then, for example, a sensor line of the vehicle component can be connected to a ground potential by another test circuit, as a result of which a short circuit is then produced in the sensor line. The vehicle component which is to be tested may be, for example, an electronic controller. An electrical connection can be established between the connection for the vehicle component and at least one of the switching contacts by switching over the switching device. In the case of the connection, there is also always an electrical connection to at least one of the switching contacts during a switchover operation. Since the vehicle component is also always connected to one of the test circuits during switchover, a switchover can be made, without transition, between a fault-free state and a faulty state which is prespecified by a test circuit. No intermediate state, in which, for example, a cable could have an unknown potential and which could have an incomprehensible influence on the vehicle component which is to be tested, is assumed during the change.

One advantageous development of this isolation adapter makes provision for in each case one test circuit, which allows fault-free operation of the vehicle component, and in each case one test circuit, by which the vehicle component can be operated with faults in a predetermined manner, to alternate with one another in a switching order which is produced by switching over the switching device. In this case, a transition can always be made starting from a fault-free state to a specific faulty state by one-off switchover. At least one of the test circuits is preferably integrated in the isolation adapter.

In a particularly robust and at the same time cost-effective embodiment of the isolation adapter, the switching contacts are provided by a tap changer, wherein the connection for the vehicle component can be electrically connected simultaneously to at least two of the switching contacts by a movable contact element. In other words, a changeover can be made between the different test circuits here in accordance with what is known as the make-before-break principle. However, it is also possible, for example, for a relay or a sliding switch to be used instead of a tap changer.

According to a second aspect, the isolation adapter firstly comprises a switching device, by which the vehicle component can be alternately connected to different test circuits, and secondly a display device for detecting and displaying a switching state of the switching device. In this case, the display device is designed, for the purpose of detecting the switching state, to mechanically detect a switching position of a switching element of the switching device. This provides the advantage that the display device can be completely electrically decoupled from the switching device and in this way the electrical signals which are conducted by the switching device are not changed by the display device.

In a particularly robust and cost-effective embodiment of this isolation adapter, a tap changer of the switching device and a tap changer of the display device are mechanically coupled to one another in such a way that switching over one of the tap changers causes the other tap changer to switch over.

A further advantage is achieved when a time profile of at least one signal which is received by the vehicle component and/or at least one emitted signal are/is recorded. In this case, an undesired behavior of the vehicle component can also be reproduced, it being possible for said behavior to be triggered only by a sequence of different faulty connection patterns of the vehicle component to the peripheral components. The isolation adapters preferably have a recording device for this purpose, said recording device being designed to provide a signal which is transmitted by the switching device to the connection for the vehicle component and/or a signal which is dependent on the switching state of the switching direction to a (logging) connection for the connection of a recording apparatus.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
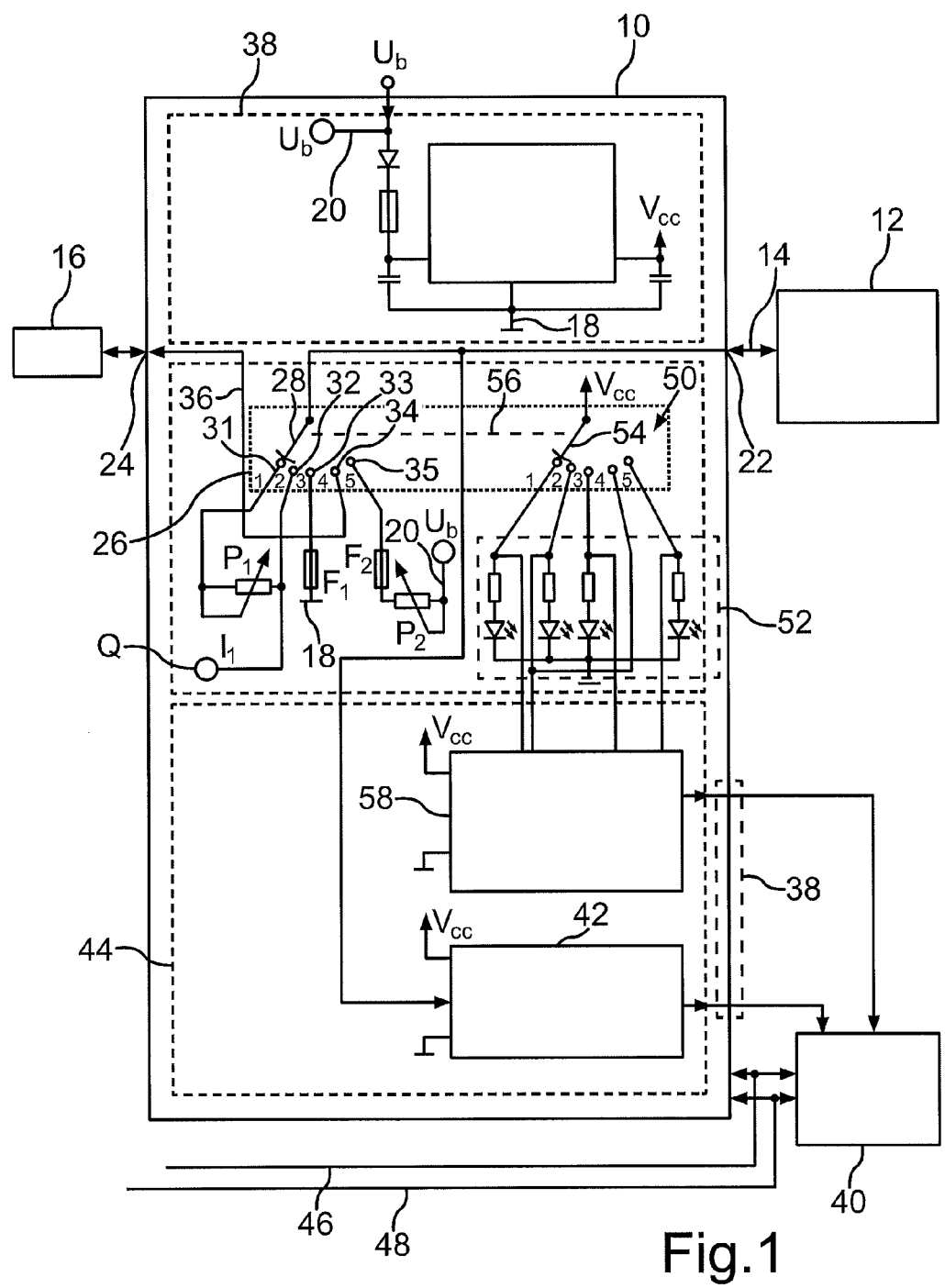
FIG. 1 shows a circuit diagram of an isolation adapter which represents one embodiment of an isolation adapter in line with the two aspects of the proposal.

Reference will now be made in detail to the preferred embodiments of the present invention, examples of which are illustrated in the accompanying drawings, wherein like reference numerals refer to like elements throughout.

The example represents one preferred embodiment.

FIG. 1 shows an isolation adapter 10 to which a controller which is to be tested is connected, said controller being called unit 12 under test here. During a test drive, the unit 12 under test is intended to be checked in respect of how it behaves when there is interference on a connecting line 14 between it and a sensor 16 and also further connecting lines (not illustrated) to other (sensors, actuators and field devices which are likewise not illustrated). One possible instance of interference here is intended to be that the connecting line 14 tears or touches a ground potential line 18 or a supply line 20, wherein said supply line carries a voltage potential Ub of a vehicle battery. A further form of interference is intended to be produced by a series resistance with which the influence of corrosion on a cable is simulated.

In order to carry out the test, the unit 12 under test and the isolation adapter 10 have been incorporated into a passenger car in which the sensor 16 and the other, abovementioned peripheral components which are to be connected to the unit 12 under test are also located, so that said unit under test can fulfill its intended function in the passenger car. The unit 12 under test is connected to a connection 22 of the isolation adapter 10, and the sensor 16 is connected to a further connection 24 of the isolation adapter 10. The connecting line 14 is connected to a tap changer 26 by the connection 22. The connection 22 can be electrically connected to different switching contacts 31, 32, 33, 34, 35 of the tap changer 26 by an adjustable contact element 28 of the tap changer 26. One end of the contact element 28, which end faces the switching contacts 31 to 35, is so wide that it can touch two adjacent switching contacts 31 to 35 at the same time. By way of example, the end can be configured in the manner of a mushroom or as a wide sliding contact. In order to switch over the tap changer 26 from a first of the switching contacts 31 to 35 to a second of the switching contacts 31 to 35, the contact element 28 is pivoted from the first switching contact to the second switching contact in this case. The end of the contact element 28 touches the second switching contact during the switchover process (here on account of its width), before the end disengages from the first switching contact. In this way, an electrical connection is first established between the contact element 28 and the second switching element during the switchover operation, before the electrical connection between the contact element 28 and the first switching contact is interrupted.

The switching contact 31 is connected to the sensor 16 by a potentiometer P1. A series resistance which acts in the sensor line can be set by the potentiometer P1 in order to simulate corrosion. In this case, a level of the manipulated line can be detected by ascertaining a current intensity of a current I1. A connecting line 36 which is coupled to the connection 24 is directly connected to the switching contacts 32 and 34. The interference signal current I1 can also be impressed into the connecting line 14 by the switching contacts 32 and 34 if the signal source is active. The switching contact 33 is connected to the ground potential line 18 of the isolation adapter 10 by a fuse F1. The switching contact 35 is connected to the supply line 20 by a fuse F2 and a potentiometer P2. In the case of the isolation adapter 10, the battery voltage Ub, an operating voltage Vcc for the isolation adapter 10 and the ground potential of the ground potential line 18 are provided by a power supply unit 38.

A recording apparatus 40 is connected to the isolation adapter 10 by a digital output 38 of said isolation adapter. The recording apparatus 40 receives a digitized variant of a sensor signal, which is transmitted from the tap changer 26 to the connection 22, from an analog/digital converter 42 of a monitoring circuit 44. The recording apparatus 40 can be, for example, a hard-disk recorder. The unit 12 under test is also connected to vehicle buses 46, 48 of the passenger car (for example a CAN bus and a Flexray bus) by the isolation adapter 10. The recording apparatus 40 is likewise connected to the vehicle buses 46, 48 and receives data which the unit 12 under test exchanges with other components of the passenger car by the vehicle buses 46, 48.

The tap changer 26 is a two-pole switch. A second pole 50 operates light-emitting diodes (see the circuit symbols in FIG. 1) of a display circuit 52 at the operating voltage Vcc. The light-emitting diodes are operated as a function of the switching position of the coupling element 28. To this end, a coupling element 54 of the pole 50 is connected to the coupling element 28 by a mechanical coupling 56.

The switching position of the coupling element 28, which switching position is mechanically ascertained in such a way, is also detected by a BCD encoder 58 (BCD—Binary Coded Decimal) by the pole 50 and displayed on the digital output 38 by a digital signal.

In addition to the tap changer 26 and the connection 24, further, comparable tap changers and connections are provided in the case of the isolation adapter 10, the unit 12 under test being connected to the other sensors, the actuators by said further tap changers and connections. Accordingly, there are also further BCD encoders and analog/digital converters which are not illustrated in FIG. 1 for reasons of clarity.

Figure 2:
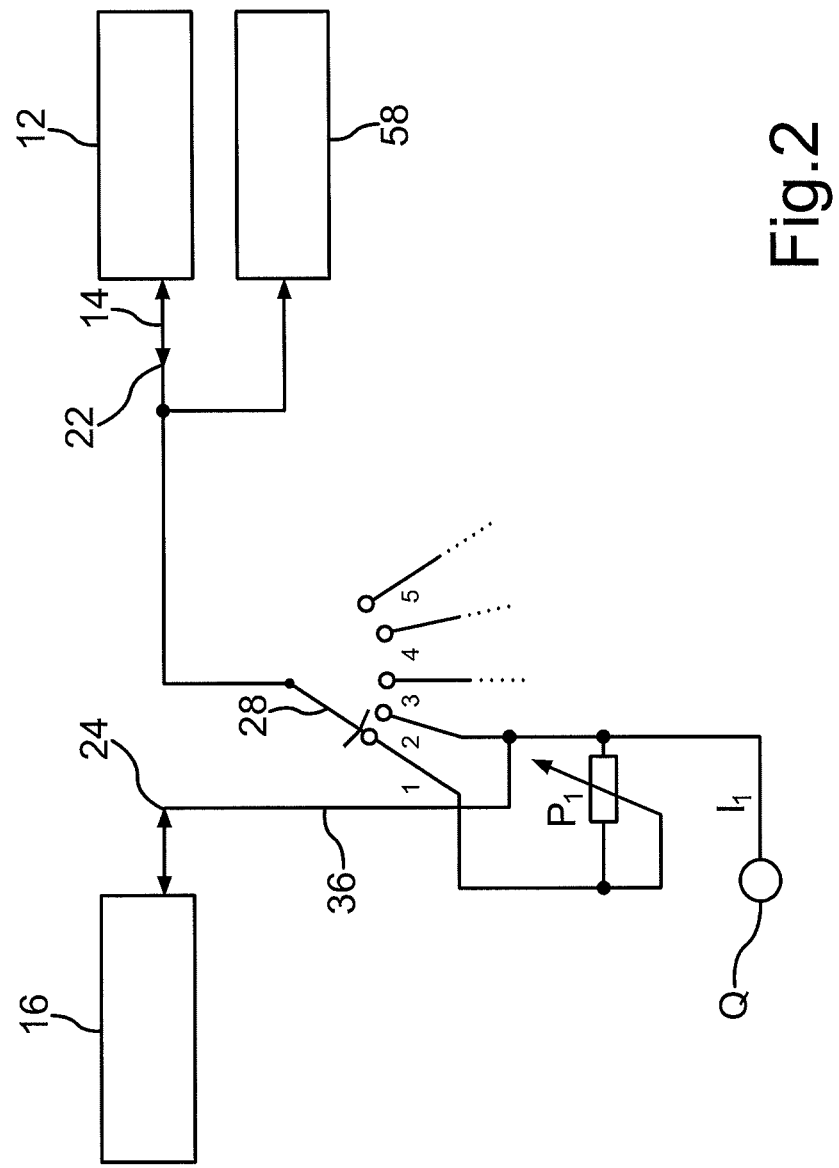
FIG. 2 shows a schematic illustration of a tap changer of the isolation adapter from FIG. 1 in a first switching position.
Figure 3:
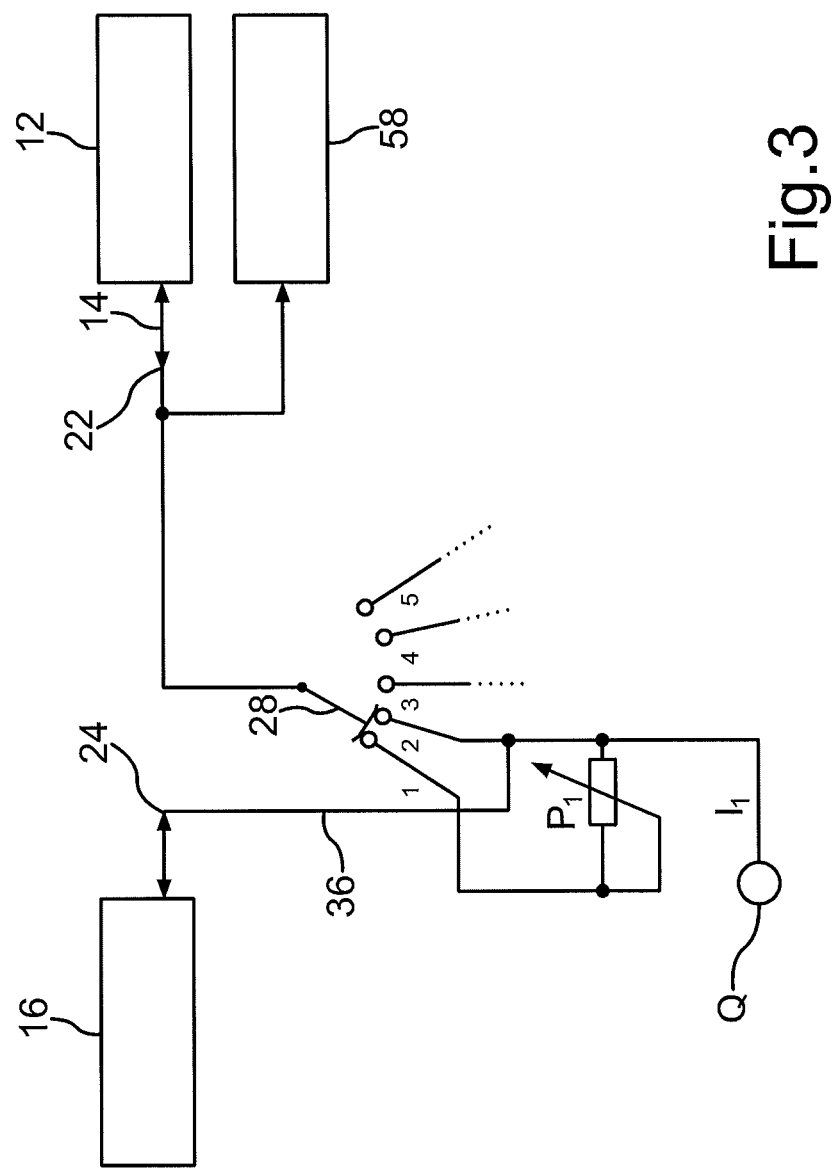
FIG. 3 shows a schematic illustration of the tap changer from FIG. 2 in a second switching position.

The text which follows explains, with reference to FIG. 1 to FIG. 4, how, in relation to the sensor 16, a total of nine switching states of the tap changer 26 can generate a corresponding number of connecting states between the sensor 16 and the unit 12 under test. FIG. 2 to FIG. 4 once again show the first pole of the tap changer 26 and also further elements which are relevant for the following explanations.

In order to facilitate understanding, the switching state is described in the text which follows in each case in the usual manner by the number of those switching contacts which are electrically connected to the contact element 28. The numbers can be found in the figures.

The nine possible switching states are:

1: series resistance in the signal line 14 (see potentiometer P1). Furthermore, it is possible to superimpose any desired signal onto the signal of the sensor 16 by the interference signal current I1 in this switch position via the signal source Q. A short circuit virtually to interruption of any fault can be simulated by the position of the potentiometer P1 (see FIG. 2).

1+2: if a signal of the signal source Q is superimposed as interference signal current I1, the sensor signal continues to be manipulated (see FIG. 3). If not, the potentiometer P1 is short-circuited and the switch position corresponds to the switch position described below.

2: no manipulation of the sensor signal.

Figure 4:
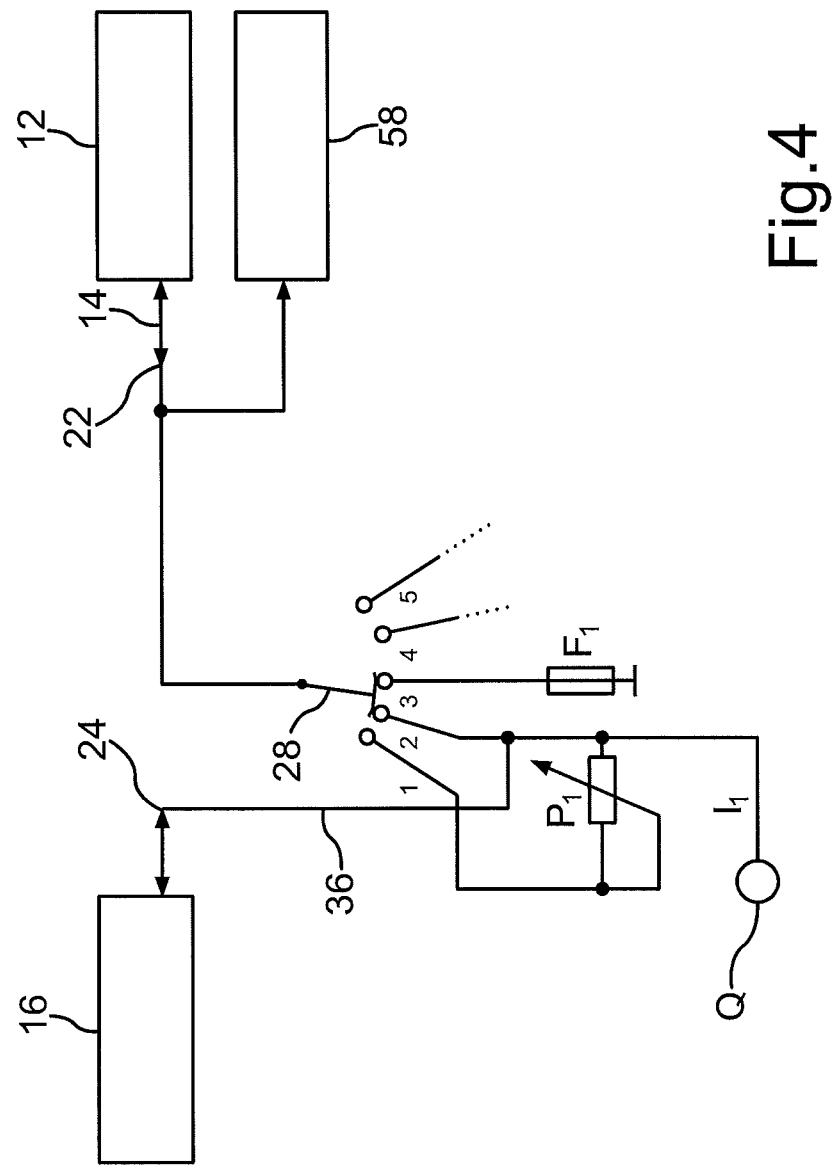
FIG. 4 shows a schematic illustration of the tap changer from FIG. 2 in a third switching position.

2+3: superimposition of a short circuit to ground (see FIG. 4).

3: superimposed short circuit to ground (corresponds to switch position 2+3), but with the connection to the sensor 16 being interrupted.

4: no manipulation of the sensor signal.

4+5: superimposed short circuit after a partial voltage of the battery voltage Ub.

5: superimposed short circuit after the partial voltage of the battery voltage Ub, with the connection to the sensor 16 being interrupted.

The unit 12 under test is always electrically connected to one of the switching contacts 31 to 35 by the tap changer 26. Since the connecting line 36 is connected to the switching contact 32 and to the switching contact 34, it is possible to switch over alternately between fault-free operation and operation with interference (with signal source Q deactivated).

If a simple switch were used instead of the tap changer 26, all of the intermediate positions which are generated by the movement of the switch would represent interruptions. This would mean that an interruption would always be produced between the sensor 16 and the unit 12 under test before the actually intended manipulation of the sensor signal.

Furthermore, on account of the mechanical coupling 56, it is possible to identify the switching state without there being any electronic components, which are necessary for operating the display circuit 52, in the entire circuit, which connects the unit 12 under test to the sensor 16.

Since the recording apparatus 40 records all of the data received from the digital output 38 and by the vehicle buses 46, 48, each operating state, in which the unit 12 under test has been found during the test drive, can be reproduced after the test drive. The times, which are required for this purpose, of the different manipulations of the connections between the unit 12 under test and the peripheral components, that is to say for example the sensor 16, and the type of manipulation can be reconstructed using the recorded data. This allows faults to be eliminated more quickly if the unit 12 under test does not behave in the specified manner. Ultimately, this results in shorter development times.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. An isolation adapter to check a functionality of a vehicle component during a test drive, comprising:
    a component connection for connection of the vehicle component;
    a switching device which is coupled to the component connection and has a plurality of switching contacts, the switching device selectively connecting the switching contacts to the component connection so as to maintain electrical connection between the component connection and at least one of the switching contacts during a switchover operation; and
    a plurality of test circuits, each test circuit being connected to a corresponding switching contact, such that each test circuit can be electrically connected to the component connection via the corresponding switching contact by switching over the switching device,
    wherein the test circuits comprise:
        at least one fault connection, which operates the vehicle component with a respective predetermined fault, and
        at least one fault-free connection, which allows fault-free operation of the vehicle component.

2. The isolation adapter as claimed in claim 1, further comprising a peripheral connection for connection of a peripheral element which is to be operated in conjunction with the vehicle component, the peripheral connection being electrically coupled to at least one of the switching contacts by at least one corresponding test circuit.

3. The isolation adapter as claimed in claim 1, wherein
    the fault and fault-free connections are provided to alternate with one another in a switching order which is produced by switching over the switching device.

4. The isolation adapter as claimed in claim 1, further comprising a recording device to provide an output signal corresponding to a signal at the component connection.

5. The isolation adapter as claimed in claim 1, wherein
    the switching contacts are provided in a switch tap changer, and
    the switch tap changer has a movable contact element by which the component connection can be electrically connected simultaneously to at least two of the switching contacts.

6. The isolation adapter as claimed in claim 1, wherein
    the switching device has a switching element to connect the vehicle component to different test circuits, the isolation adapter further comprises a display device to detect and display a switching state of the switching device, and
to detect the switching state, the display device mechanically detects a switching position of the switching element of the switching device.

7. The isolation adapter as claimed in claim 6, wherein
the switching device is a switch tap changer,
the switching element of the switching device is a movable contact element of the switch tap changer,
the display device comprises a display tap changer having a movable contact element, and
the movable contact elements of the switch tap changer and the display tap changer are mechanically coupled to one another in such a way that the tap changers switch together.

8. The isolation adapter as claimed in claim 6, wherein an output device provides an output signal which is dependent on the switching state of the switching device, the output signal being provided to a logging connection for connection of a recording apparatus.

9. The isolation adapter as claimed in claim 1, further comprising:
a logging connection for connection of a recording apparatus;
a recording device to provide an output signal to the logging connection, which corresponds to a signal at the component connection; and
an output device to provide an output signal to the logging connection, which is dependent on the switching state of the switching device.

10. An isolation adapter to check a functionality of a vehicle component during a test drive, comprising:
a component connection for connection of the vehicle component;
a switching device which is coupled to the component connection and has a plurality of switching contacts, the switching device selectively connecting the switching contacts to the component connection so as to maintain electrical connection between the component connection and at least one of the switching contacts during a switchover operation; and
a plurality of test circuits, each test circuit being connected to a corresponding switching contact, such that each test circuit can be electrically connected to the component connection via the corresponding switching contact by switching over the switching device,
wherein the test circuits are selected from the group consisting of a series resistance, a connection to ground and a connection to a power supply.

11. A method for checking a functionality of a vehicle component during a test drive, comprising:
switching over without interruption between at least first and second test circuits, wherein
the first test circuit provides an electrical connection between the vehicle component and a sensor, actuator or field device, which is to be operated in conjunction with the vehicle component,
the first test circuit connects the vehicle component to the sensor, to the actuator or to the field device in a manner which is intended for fault-free operation of the vehicle component,
the second test circuit provides an electrical connection which generates a prespecified faulty operational state in the vehicle component, and
the vehicle component is always connected to one of the test circuits during switchover.

12. The method as claimed in claim 11, wherein
a component connection is used to electrically connect the vehicle component with the first and second test circuits, and
the method further comprises recording a time profile of a signal which is present at the component connection.

* * * * *